(12) United States Patent
Hamilton (10) Patent No.: US 7,533,665 B2
(45) Date of Patent: *May 19, 2009

(54) DICING SAW BLADE POSITIONING APPARATUS AND METHODS INDEPENDENT OF BLADE THICKNESS VIA CONSTRAINED BIASING ELEMENTS

(75) Inventor: Ernest J. Hamilton, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/177,526

(22) Filed: Jul. 8, 2005

(65) Prior Publication Data

US 2005/0245172 A1 Nov. 3, 2005

Related U.S. Application Data

(63) Continuation of application No. 10/003,500, filed on Oct. 23, 2001, now Pat. No. 6,962,147.

(51) Int. Cl.
*B28D 1/04* (2006.01)
(52) U.S. Cl. .................. 125/13.01; 83/663; 83/664
(58) Field of Classification Search .............. 125/13.01, 125/13.03; 83/664, 663
See application file for complete search history.

(56) References Cited

U.S. PATENT DOCUMENTS

| | | | | |
|---|---|---|---|---|
| 1,780,247 A | * | 11/1930 | Simpson | ................. 83/673 |
| 3,285,302 A | | 11/1966 | Thrasher | |
| 3,631,907 A | * | 1/1972 | Laska | ................. 241/292.1 |
| 3,691,707 A | | 9/1972 | Von Arx et al. | |
| 3,897,020 A | * | 7/1975 | Knecht | ................. 83/675 |
| 4,180,048 A | | 12/1979 | Regan | |
| 4,219,004 A | | 8/1980 | Runyon | |
| 4,275,631 A | * | 6/1981 | Wingen | ................. 83/501 |
| 4,429,837 A | * | 2/1984 | Knecht | ................. 83/664 |
| 5,259,149 A | | 11/1993 | Klievoneit et al. | |
| 5,261,385 A | | 11/1993 | Kroll | |
| 5,313,742 A | | 5/1994 | Corcoran et al. | |

(Continued)

FOREIGN PATENT DOCUMENTS

DE 004239570 A1 5/1994

OTHER PUBLICATIONS

Marked up copy of iTi Precision Pitch Spacing System.*

(Continued)

*Primary Examiner*—Maurina Rachuba
(74) *Attorney, Agent, or Firm*—TraskBritt (57) ABSTRACT

An apparatus for positioning dicing saw blades at a fixed axial distance from one another independent of the thicknesses of the saw blades, where the saw blade thickness varies within a range. Flanges, spacers, and retention elements may be employed to achieve desired spacing of dicing saw blades in an assembly. At least one biasing element that is at least partially constrained about its outer radial periphery may be employed to achieve axial positional independence of each dicing saw blade with respect to other dicing saw blades of the assembly. Further, at least one retention feature may also be used to fix the position of the at least one biasing element in the assembly. Machining techniques may be used to form the components and features of the present invention.

45 Claims, 9 Drawing Sheets

U.S. PATENT DOCUMENTS

| | | | |
|---|---|---|---|
| 5,571,040 | A | 11/1996 | Kawaguchi et al. |
| 5,934,973 | A | 8/1999 | Boucher et al. |
| 6,012,372 | A | 1/2000 | Laster et al. |
| 2002/0157657 | A1 | 10/2002 | Toledano |

OTHER PUBLICATIONS

Industrial Tools Incorporated, "Precision Pitch Spacing System (PPSS)."

* cited by examiner

DICING SAW BLADE POSITIONING APPARATUS AND METHODS INDEPENDENT OF BLADE THICKNESS VIA CONSTRAINED BIASING ELEMENTS

CROSS-REFERENCE TO RELATED APPLICATION

This application is a continuation of application Ser. No. 10/003,500, filed Oct. 23, 2001, now U.S. Pat. No. 6,962,147, issued Nov. 8, 2005.

BACKGROUND OF THE INVENTION

1. Field of the Invention

The present invention relates to accurately positioning blades in a multiple blade assembly for dicing wafers and other substrates used in the manufacture of electronic devices. More specifically, the present invention teaches an apparatus for accurately positioning an edge of each blade in a multiple blade assembly, irrespective of the individual blade thicknesses.

2. Background of Related Art

In order to manufacture carrier substrates (e.g., circuit boards, interposers, etc.) and semiconductor dice in quantity, a large-scale substrate comprising a large number of unsingulated units is typically processed en masse, then the units separated from one another, typically by sawing the large-scale substrate. In the case of carrier substrates, the large-scale substrate may be either a single-layered or laminated organic substrate, such as FR-4 board, upon which a number of carrier substrates are formed. Semiconductor dice may be fabricated on a wafer or other large-scale semiconductor substrate. The dice may then be scribed or sawn into individual dice. Singulated carrier substrates and semiconductor dice are often used in finishing operations, including packaging. As the state-of-the-art densities of carrier substrates and semiconductor dice on their respective large-scale substrates are ever increasing, the need for accurate rigid placement of dicing saw blades is apparent.

Semiconductor wafers and other substrates are typically manufactured with a multitude of semiconductor devices. Typically, individual semiconductor devices are attached to a carrier substrate via tape-automated-bonding ("TAB"), wire bonding, or flip-chip type solder bonding techniques, the latter often effectuated with so-called ball grid array (BGA) configurations of discrete solder balls. Consequently, individual semiconductor devices must be singulated, or separated from each other for use, packaging, and mounting on carrier substrates such as printed circuit boards. Furthermore, the singulated devices may be encapsulated or otherwise "sealed" to protect the electrical connections and chip from environmental damage or contamination.

In order to singulate or perform "dicing" operations on large-scale substrates, dicing saws are typically used. Apparatus for dicing wafers and other substrates usually comprise at least one saw blade attached to a spindle, which rotates via a motor attached thereto. Also, during cutting, cleaning fluid such as deionized water is communicated to the substrate and saw blade to wash away cuttings of the substrate material and cool the saw blade.

Increasingly, rapid manufacturing methods include multiple or "gang" saw blade assemblies. In addition, due to semiconductor device and carrier substrate density on the respective large-scale substrate and the attendant necessity for making cuts between the semiconductor devices or carrier substrates as narrow as possible, the individual saw blades are relatively thin. Further, in order to exact precision cuts with reduced forces on the substrate during cutting, dicing saw blades are rotated at relatively high speeds, up to 60,000 revolutions per minute. Dicing saw blades may also be termed "wear blades," and may include diamond grit proximate their outer edges, although other hard, natural and synthetic particulate materials may be used. Some examples of dicing saw blade materials include: diamond grit encapsulated in resin, diamond grit encapsulated by an electro-deposited nickel film, and diamond grit held in a soft metal. Resin bonded diamond grit blades may be about 0.025 mm to about 0.380 mm thick (e.g., 0.260 mm thick) and about two or three inches or more (e.g., 4.5 inches) in diameter.

Saw blade flexibility is also a concern, because it directly affects deflection and movement of the cutting edge out of the desired vertical plane perpendicular to the substrate, such deflection being known in the art as "run-out," during cutting. To obtain trueness and stability during cutting, and to minimize run-out, the blades are typically mounted between two flanges so that only a small cutting edge at the outer periphery of the blades is exposed. It has been observed that the maximum depth of cut of the blade held by a flange is limited by the flexibility of the blade.

Due to the extreme processing requirements of dicing saw blades, as well as the increasing density of semiconductor devices on substrates and wafers, as well as the fine tolerances between adjacent carrier substrates or other electrical assemblies (dice) formed on large-scale substrates, accurate placement and control of dicing processes and apparatus is extremely important.

For instance, U.S. Pat. No. 5,571,040 to Kawaguchi et al. discloses a method and device for detecting and controlling the run-out of a flat ring blade member of a slicing machine. Kawaguchi et al. discloses measuring an axial load, calculating a deflection value for the blade, then adjusting for the calculated run-out.

U.S. Pat. No. 5,259,149 to Klievoneit et al. discloses an apparatus and method for grinding opposed faces of the hub of a dicing saw blade flat and parallel while preserving the capability of electroplating the hub with a membrane. Thus, Klievoneit et al. addresses accurate positioning of dicing saw blades, as well as methods of manufacture. However, the Klievoneit et al. process is expensive due to the increased processing time and materials, thus increasing the cost of dicing saw blades.

Figure 1A:
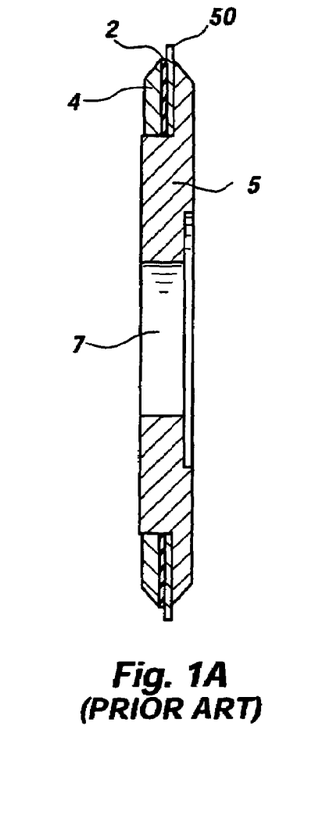
FIG. 1A is a side cross-sectional view of a typical diamond blade flange assembly, where a compliant layer is adjacent the blade.
Figure 1B:
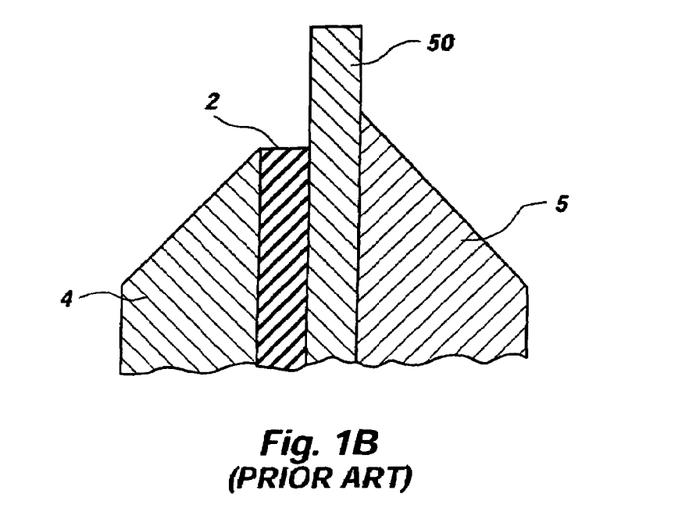
FIG. 1B is an enlarged view of the diamond blade tip of the diamond blade flange assembly of FIG. 1A.

In addition, U.S. Pat. No. 4,180,048 to Regan discloses a cutting wheel for dicing semiconductor wafers. FIG. 1 and FIG. 2 of Regan show the cutting wheel in detail, including a thin layer of elastomer in contact with the cutting wheel or blade. FIG. 1 and FIG. 2 of Regan have been adapted as FIGS. 1A and 1B, respectively. Configuring the blade to be in direct axial contact with an elastomer is undesirable as it reduces the stiffness of the mounted blade. In addition, the elastomer is not constrained on the outer radial periphery, allowing for flexure in the dicing saw blade.

Referring to FIG. 1A, dicing saw blade 50 is installed on flange 5 and held thereon by retaining element 4. Flange 5 is configured to accommodate dicing saw blade 50, compliant layer 2 and retaining element 4 within the axial thickness of the flange 5. Compliant layer 2 is placed between retaining element 4 and dicing saw blade 50, retaining element 4 being held compressively against dicing saw blade 50. Retaining element 4 may be installed on a spindle (not shown) by way of bore 7. The spindle (not shown) may be threaded on one or both ends for applying axial compressive forces to retaining element 4, thus holding dicing saw blade 50 in place. Other compression elements as known in the art may be employed to compress the assembly.

Flange 5 along the radial tip of the dicing saw blade 50 may be tapered, as may the radial tip of retaining element 4, as shown in FIG. 1B. Tapering the retention means of the dicing saw blade 50 gives axial clearance to each side of the dicing saw blade 50 when compared to nontapered alternatives. Compliant layer 2 is located between retaining element 4 and dicing saw blade 50. Thus, during cutting, the dicing saw blade 50 is axially supported on one side by flange 5 and on the other side by retaining element 4 and compliant layer 2. Multiple assemblies of dicing saw blades 50, retaining elements 4, and flanges 5 may be axially positioned adjacent to each other to form a multiblade assembly.

Figure 2:
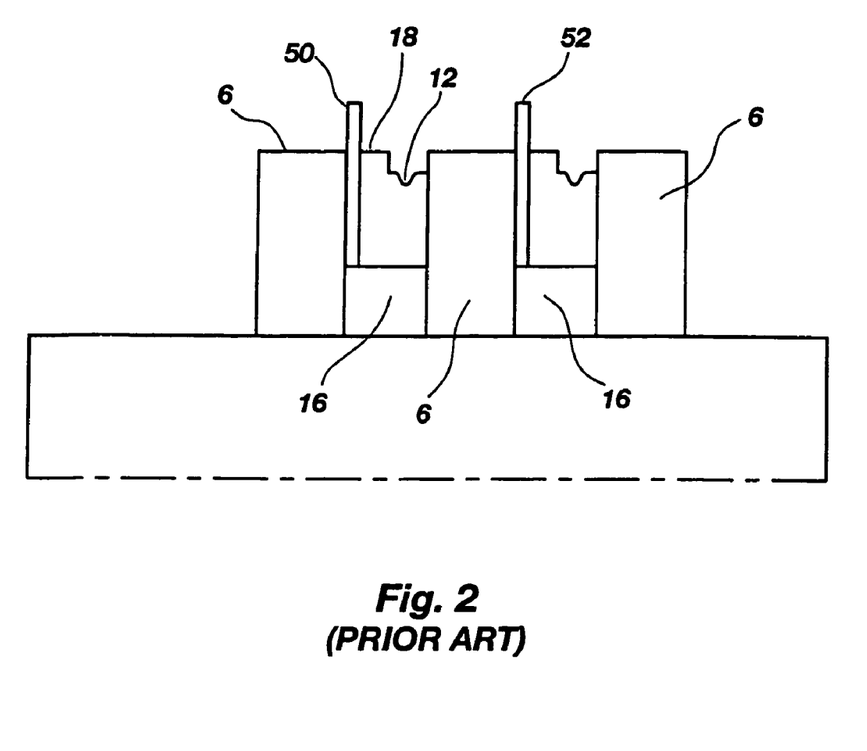
FIG. 2 is a side cross-sectional view of a typical configuration of a multiple dicing saw blade assembly which includes a compliant element.

Industrial Tools Incorporated ("ITI") employs a dicing saw blade spacing apparatus that uses a series of circumferentially unconstrained rings to hold the blade in place. A compression ring of stiff, yet resilient material and retention spacer adjusts for the thickness of the dicing saw blade. The resilient material is not, however, constrained about its outer circumferential surface. This configuration allows for the blade to deflect more easily. In addition, ITI utilizes a series of spacers and fixtures to fix each blade position, which may increase costs and complexity of the apparatus. FIG. 2 illustrates the system developed by ITI.

FIG. 2 shows an assembly including multiple dicing saw blades 50. Moving left to right in FIG. 2, a first retention element 6 provides a seating surface for dicing saw blade 50, where dicing saw blade 50 is radially supported by spacer 16. Contact spacer 18 is positioned axially adjacent to dicing saw blade 50 between dicing saw blade 50 and compliant element 12. A second retention element 6 is positioned and compressed against compliant element 12, in lateral contact with spacer 16. Multiple dicing saw blades may be positioned by repeating the aforementioned elements as shown for a second dicing saw blade 52.

Systems for mounting dicing saw blades, shown in FIGS. 1A, 1B, and 2, may compensate for varying diamond dicing saw blade thicknesses in a multiple dicing saw blade assembly. However, the foregoing systems require that the compliant element or layer have a large, ring-shaped configuration to facilitate radial placement thereof by its inner diameter since neither of the illustrated configurations radially peripherally constrains the compliant element or layer. Such configurations limit the design alternatives of the compliant element.

Although diamond saw blades may be very accurately manufactured via lapping technology, increased blade thickness accuracy also increases the cost of the dicing saw blades. Furthermore, little advantage in the way of durability or improved life is gained by such accurate tolerances. Accordingly, it would be advantageous to use dicing saw blades with varying thicknesses while retaining accurate and rigid axial positioning of each dicing saw blade in a multiple dicing saw blade assembly.

Thus, it can be understood that accurate and rigid positioning of dicing saw blades of variable thicknesses is of great importance in the manufacture of semiconductor devices. In addition, it is desirable to eliminate the locational effect of the variation in the thickness of the dicing saw blades on the axial locations of other dicing saw blades in a multiple dicing saw blade assembly.

SUMMARY OF THE INVENTION

The present invention relates to an apparatus for accurately and rigidly positioning dicing saw blades that vary somewhat in thickness in a multiple dicing saw blade assembly.

In a single dicing saw blade assembly, at least one axial surface of the saw blade may be determined accurately. Fixtures, such as the spindle, as well as spacers, hubs, or other fixture surfaces may accurately determine a position of at least one plane of a dicing saw blade along an axis of rotation of the dicing saw blade. However, in the case of a typical multiple dicing saw blade assembly, the thickness of a saw blade affects each subsequent axial position of each saw blade assembled along the length of the spindle thereafter. Each blade, unless perfectly sized, causes the next blade to deviate axially from its desired position.

The present invention includes a dicing saw assembly that accepts saw blades of different thicknesses while positioning each saw blade of the ganged assembly in a desired axial position along the length of the spindle of the dicing saw. Thus, in a dicing saw assembly including multiple blades, the position of at least one surface of any dicing saw blade of the assembly is independent of the thickness of any other dicing saw blade in the assembly. Positional independence of each dicing saw blade may be accomplished by configuring at least one constrained biasing element between a dicing saw blade and at least another dicing saw blade. In addition, a biasing element retention feature is formed proximate to at least one surface that the biasing element separates in order to maintain positional independence of each dicing saw blade.

Further, the number of spacers may be reduced to reduce the aggregation of variance in the assembly. For instance, if two spacers are stacked, their tolerances are additive. If two stacked spacers have the same dimensional accuracy, then the variance of the stacked assembly is simply two times the variance of a single spacer. Addition of tolerances is referred to herein as "tolerance stackup," which refers to the addition of tolerances in assemblies. However, if two or more spacers can be replaced by one spacer, the variance in the overall stacked size of the spacer is reduced. In addition, costs may be reduced by reducing the number of spacers required to rigidly position the dicing saw blades.

Accordingly, the present invention accurately and rigidly positions dicing saw blades with respect to other dicing saw blades in a multiple dicing saw blade assembly and may also reduce so-called tolerance stackup.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments of various aspects of the invention.

DETAILED DESCRIPTION OF THE INVENTION

Figure 3A:
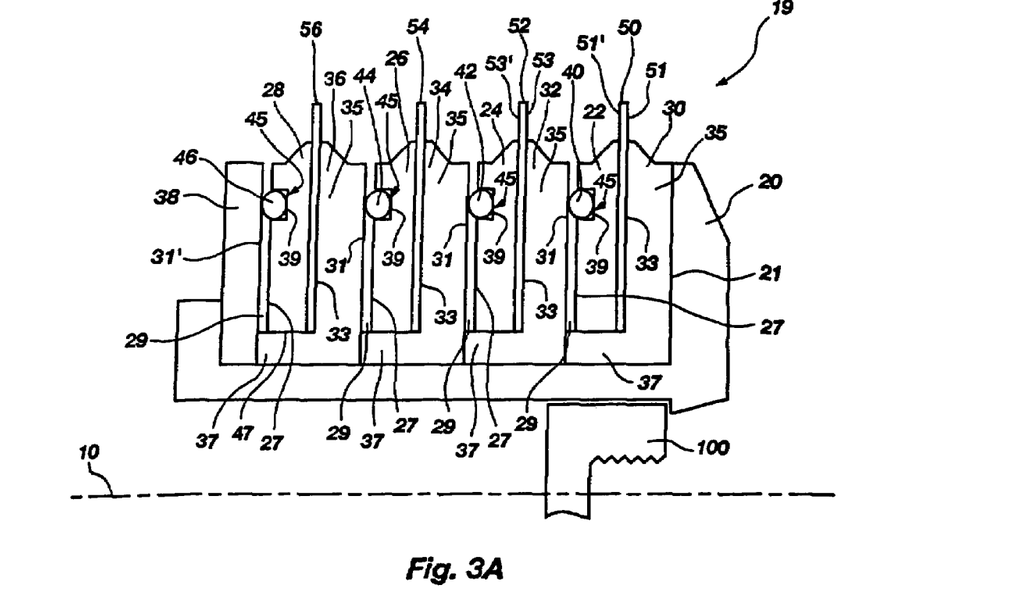
FIG. 3A is a side cross-sectional view of a first embodiment of a blade retention assembly incorporating the teachings of the present invention.

FIG. 3A shows an embodiment of the present invention where dicing saw blade 50 is positioned by way of a shaped flange 30 installed axially adjacent and matingly with hub surface 21. Shaped flange 30 includes a substantially radially extending support member 35 and a substantially axially extending spacer member 37. Spacer member 37 matingly engages a corresponding retention element 22, with an aperture 47 formed through retention element 22 receiving spacer member 37, in such a manner as to retain a dicing saw blade 50 between support member 35 and retention element 22. Shaped flange 30 is one piece, thereby reducing tolerance stack up with respect to each dicing saw blade position. Retention element 22 may contain a retention feature 45 to accommodate a biasing element 40. Biasing element 40 compresses or deflects axially as an axially adjacent shaped flange 32 abuts shaped flange 30. Each dicing saw blade and retention means is configured to install about hub 20, which rotates on a shaft (not shown) about axis 10.

Further, a means to compress dicing saw blade retention assembly 19 is also provided. For instance, the hub 20 may be threaded on one end, and compressive forces may be imparted to the dicing saw blade retention and spacing means by tightening the threaded connection. A schematic illustration of one possible means to compress a blade retention assembly is shown in FIG. 8. Compressive forces may be applied to the shaped flanges 30 by way of threaded element 114, engaging threaded proximate end 116 of hub 20 installed onto the spindle 102. As the threaded connection between the hub 20 and the threaded element 114 is tightened, the threaded element 114 matingly engages and axially compresses the axially adjacent surface of the shaped flange 30 distal to hub surface 21. Thus, threaded element 114 compresses the assembly of shaped flanges 30, as each communicate and distribute the compressive force axially throughout the assembly. Alternatively, in other embodiments shown in FIG. 3A, FIG. 4A, and FIG. 7, the threaded element 114 may matingly engage and axially compress a spacer, end spacer, or other component in order to compress the assembly of shaped flanges 30.

With continued reference to FIG. 8, connection to a drive to rotate dicing saw blade retention assembly 19, such as an electric motor, may be accomplished via compressive engagement of tapered surface 104 and tapered surface 105 of the hub 20 and spindle 102, respectively. A threaded section 108 of the spindle 102 engages a threaded hole 112 of a nut 100 positioned within the hub 20, along the rotational axis 101 thereof, to compress the tapered surface 104 against the tapered surface 105. Thus, the tapered surface 104 and tapered surface 105 center the dicing saw blade retention assembly 19 with respect to the rotational axis 101 of the spindle 102. Other compressive, centering, and attachment means are known in the art. Collets, keyways, and chucks are a few examples of well-known attachment means employed in rotating machinery. The present invention is not limited to any one configuration.

The dicing saw blade retention assembly 19, as shown in FIG. 3A, configures axially adjacent dicing saw blades to be spaced a fixed axial distance from one another. More specifically, the surface 51 of dicing saw blade 50 is a fixed axial distance from the congruent surface 53 of second dicing saw blade 52. Dicing saw blade thickness (i.e., the distance between surface 51 and 51') causes the associated retention element 22 to be displaced toward the adjacent shaped flange 32. Thus, the retention element 22 accommodates dicing saw blades of different thicknesses without changing the distance between surface 51 of dicing saw blade 50 and congruent surface 53 of second dicing saw blade 52. However, in this embodiment, changing the dicing saw blade spacing requires changing the dimensions of each shaped flange, since the axial dimension of each shaped flange influences the axial position adjacent dicing saw blade(s).

Significantly, dicing saw blade 50 is positioned between two rigid bodies. Additionally, shaped flange 30 and retention element 22 each may be tapered toward the radial tip of dicing saw blade 50, thus imparting rigid support to the radial blade tip. Also, tapering provides clearance around the edges of the dicing saw blades, so that the radial tips of the flange and spacer do not collide with any components or features that extend from the surface of the wafer or other substrate during dicing. Additional dicing saw blades may be assembled as shown by way of additional shaped flanges 32, 34, and 36 as well as corresponding retention elements 24, 26, and 28. Furthermore, each retention element 24, 26, and 28 engages a biasing element 42, 44, and 46, respectively. Ideally, shaped flanges 32, 34, and 36 are machined to identical axial thicknesses to facilitate accurate positioning of dicing saw blades 50, 52, and 54. An end spacer 38 may be employed to distribute compressive force to the assembly of dicing saw blades and retention means, as well as engage biasing element 46.

Figure 3B:
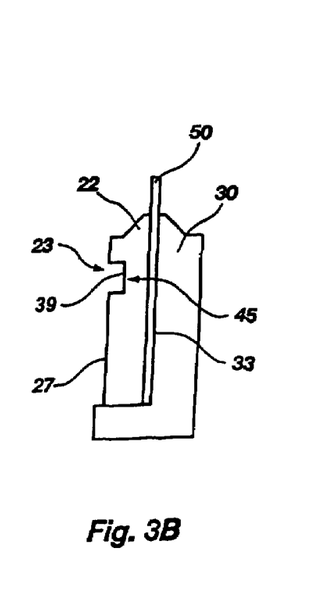
FIG. 3B is a side cross-sectional view of a shaped flange and associated retention spacer assembly incorporating the teachings of the present invention.

Biasing elements 40, 42, 44, and 46 may be substantially circumferentially or peripherally constrained. As shown in FIG. 3B, a recess 23 is formed in a substantially planar retention surface 27 of each retention element 22, 24, 26, and 28, exemplified in FIG. 3B by retention element 22. Recess 23 is sized to at least partially receive a portion of at least one biasing element (not shown) with another portion of the at least one biasing element protruding axially from the radial surface 27 of each retention element 22, 24, 26, and 28.

Circumferential or peripheral constraint applied to a biasing element of the present invention is advantageous to provide control of the axial biasing face provided thereby.

Biasing elements may be shaped in almost any geometry. A biasing element of the present invention may be placed anywhere radially in the available radial surface area of the retention element 22, may comprise a spring, washer spring, O-ring, disc spring, or other biasing means, and may or may not comprise a circular geometry. The biasing element of the present invention is held in place at least partially by constraint at least about its outer radial periphery with respect to the axis 10 of rotation. Radial peripheral constraint provides flexibility in design and functionality for biasing elements of the present invention.

Figure 3C:
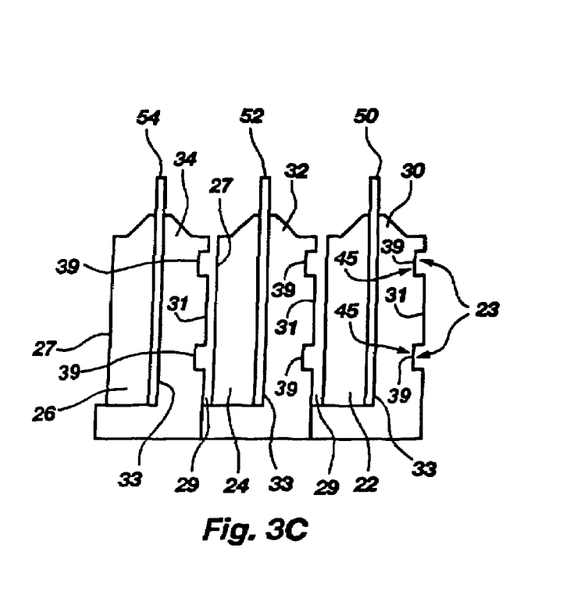
FIG. 3C is a side cross-sectional view of an assembly of shaped flanges and associated retention spacers in an assembly incorporating the teachings of the present invention.
Figure 5A:
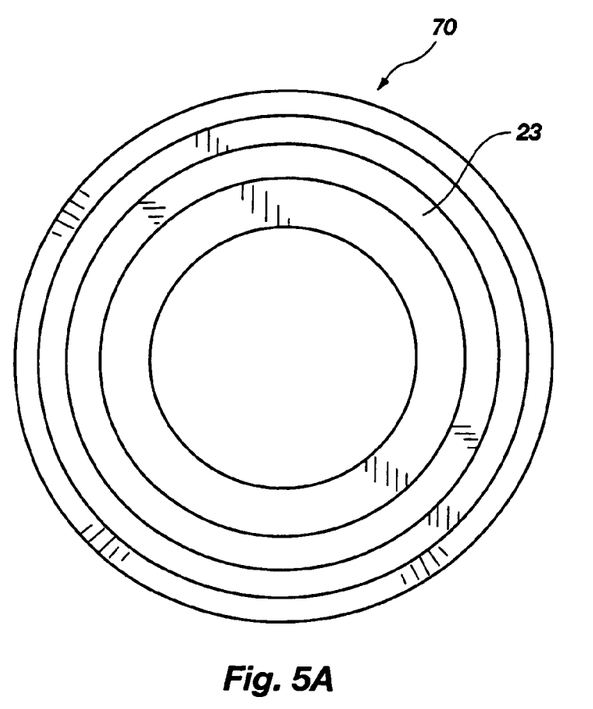
FIGS. 5A and 5B are top and side views, respectively, of an embodiment of a retention ring incorporating teachings of the present invention.
Figure 5B:
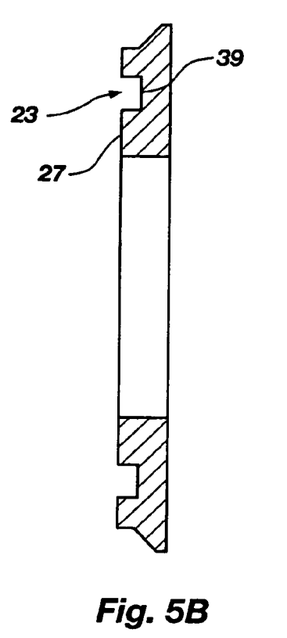

Although retention element 22 is depicted as being formed with a retention feature 45 therein, at least one retention may alternatively be configured into shaped flanges 32, 34, 36, and end spacer 38. A recess 23 is only one embodiment for a retention feature 45 of the present invention. Protrusions may also be used to fix or retain the biasing element, as well as threads, pins, or other fastener elements known in the art. FIG. 3C shows shaped flanges 30, 32, and 34 configured with multiple recesses 23. Shaped flange recesses 23 at least partially circumferentially or peripherally constrain respective biasing elements (not shown). FIGS. 5A and 5B show top and side views, respectively, of a substantially circular retention spacer 70 with a grooved recess 23 for at least partially containing and constraining at least one annular biasing element (not shown) about its outer radial periphery. Biasing element(s) may be configured into the grooved recess 23 to provide axial adjustment for dicing saw blade thickness as well as compressive forces to axially adjacent retention spacers in a dicing saw blade retention assembly. Grooved recess (es) 23 may be radiused, circular, square, tapered, or otherwise configured to at least partially accept a biasing element therein.

Significantly, and referring again to FIG. 3A, the present invention accommodates dicing saw blades of differing thickness in an assembly while retaining accurate axial positioning of each blade. Dicing saw blade 50 causes retention element 22 to displace toward shaped flange 32. Accordingly, biasing element 40 is compressed between radial surface 39 of the recess and axial surface 31 of the shaped flange 32. Axial distance 29 between radial surface 27 of a retention spacer and axial surface 31 or 31' depends on the thickness of the dicing saw blade. However, shaped flanges 30, 32, 34, and 36 as well as corresponding retention elements 22, 24, 26, and 28 are designed so that radial surface 27 of any retention spacer does not contact any axial surface 31 or 31'. Thus, the dicing saw blade thickness does not influence the axial position of adjacent shaped flanges and therefore does not influence the position of any other blades assembled within the dicing saw blade retention assembly 19 of the present invention.

Figure 4A:
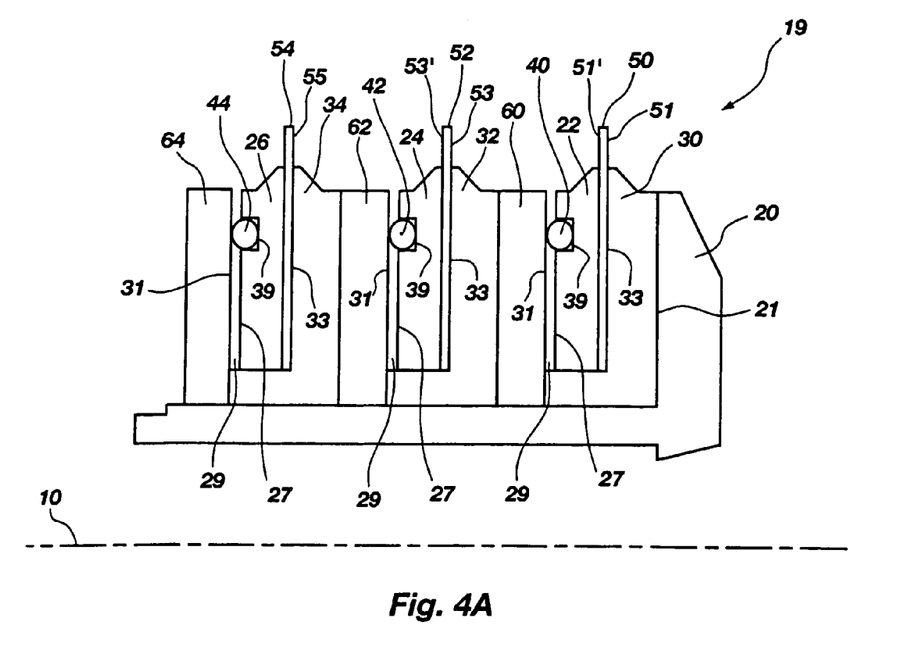
FIG. 4A is a side cross-sectional view of a second embodiment of a blade retention assembly incorporating the teachings of the present invention.

FIG. 4A shows a second embodiment of a dicing saw blade retention assembly 19 incorporating teachings of the present invention, where auxiliary pitch spacers 60, and 62 are employed to provide additional desired axial spacing distance between dicing saw blades 50, 52, and 54. Ideally, shaped flanges 32, 34, and 36 (not shown in FIG. 4A) as well as auxiliary pitch spacers 60 and 62 are machined to substantially identical axial thicknesses to accurately position dicing saw blades 50, 52, and 54. End spacer 64 may be installed to distribute axial compressive force to the dicing saw blade retention assembly 19 as well as engage biasing element 44.

Specifically, the surface 51 of dicing saw blade 50 is a fixed axial distance from the congruent surface 53 of dicing saw blade 52, determined by the axial position of the dicing saw blade 50 within shaped flange 30, the axial dimension of auxiliary pitch spacer 60, and the axial position of dicing saw blade 52 within shaped flange 32. Upon installing a dicing saw blade 50 within shaped flange 30 the blade thickness (i.e., the distance between surface 51 and 51') causes the associated retention element 22 to be displaced toward the adjacent auxiliary pitch spacer 60. Thus, the retention elements 22 and 24 accommodate dicing saw blades 50 and 52 of different thicknesses without changing the axial distance between surface 51 and congruent surface 53 as well as the distance between surface 53 and surface 55. The use of auxiliary spacers according to the present invention may be advantageous to achieve desired dicing saw blade spacing without changing the shaped flange or retention spacer configuration as would be required to change the dicing saw blade spacing in the embodiment shown in FIG. 3A.

Figure 4B:
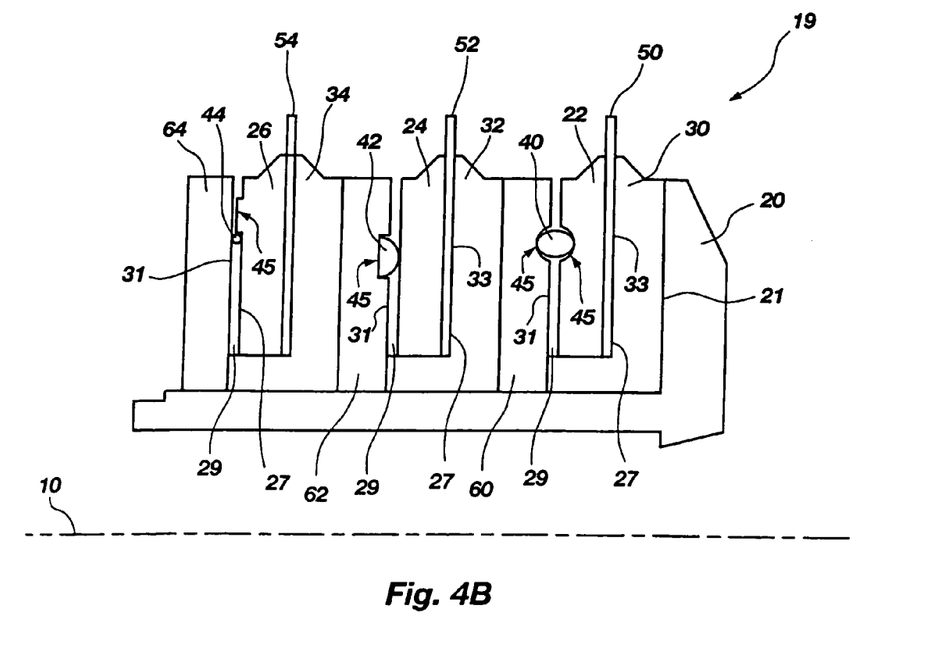
FIG. 4B is a side cross-sectional view illustrating multiple embodiments of biasing element retention features of a blade retention assembly incorporating the teachings of the present invention.

As mentioned hereinbefore, and with reference to FIG. 4B, a retention feature 45 may be included in order to fix the radial position of the at least one biasing element with respect to the axis 10 of rotation. The retention feature 45 may comprise at least one indentation. Alternatively, or additionally, the retention feature 45 may comprise at least one protrusion. FIG. 4B shows several embodiments of retention features 45 in a dicing saw blade retention assembly 19. As a first example, retention element 22 is formed with an arcuate indentation as a retention feature 45 for biasing element 40. In addition, auxiliary pitch spacer 60 is also configured with an arcuate indentation as a retention feature 45 for constraining biasing element 40. A second example includes a retention feature 45 configured into auxiliary pitch spacer 62 only, and is a generally planar radial surface with axial walls, thus forming a recess to constrain biasing element 42. Biasing element 42 is shown as a thin compressible button, illustrating another possible embodiment. A third example for retention feature 45 illustrated in FIG. 4B is a protrusion extending axially from radial surface 27 of retention element 26. Retention feature 45 of retention element 26 provides, among other things, a radial ledge to fix the position of the biasing element 44. Thus, retention feature 45 may comprise at least one indentation and/or protrusion for receiving at least one biasing element.

Figure 6A:
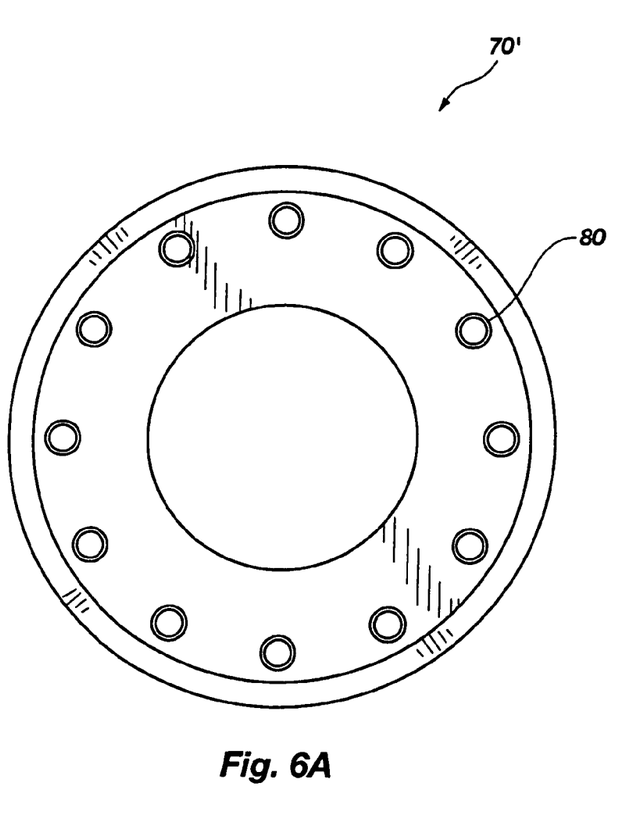
FIGS. 6A and 6B are top and side views, respectively, of an embodiment of a retention ring incorporating teachings of the present invention.
Figure 6B:
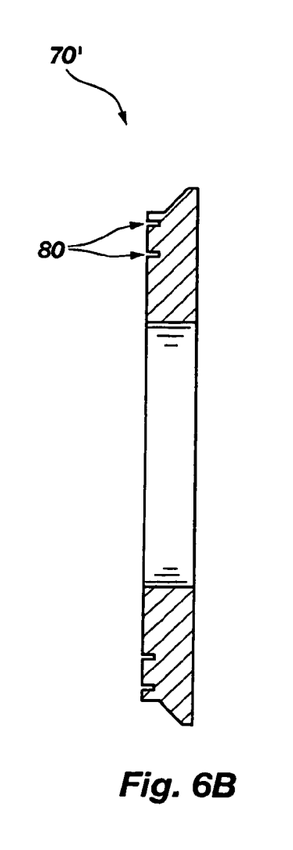

FIG. 6A illustrates a second embodiment of a retention spacer 70' with individual circumferentially spaced recesses 80 for biasing elements. Biasing elements may comprise disc springs, washer springs, coil springs, elastomeric O-rings, other solid pliable materials, or other biasing means known in the art. Further, although recesses 80 are shown as substantially circular grooves of constant depth, recesses 80 may comprise other geometries. For instance, recesses 80 may comprise substantially rectangular shapes with tapering or nonconstant depths. Recesses 80 may also be threaded, slotted, keyed, splined, or otherwise configured to accept at least one biasing element.

Figure 6C:
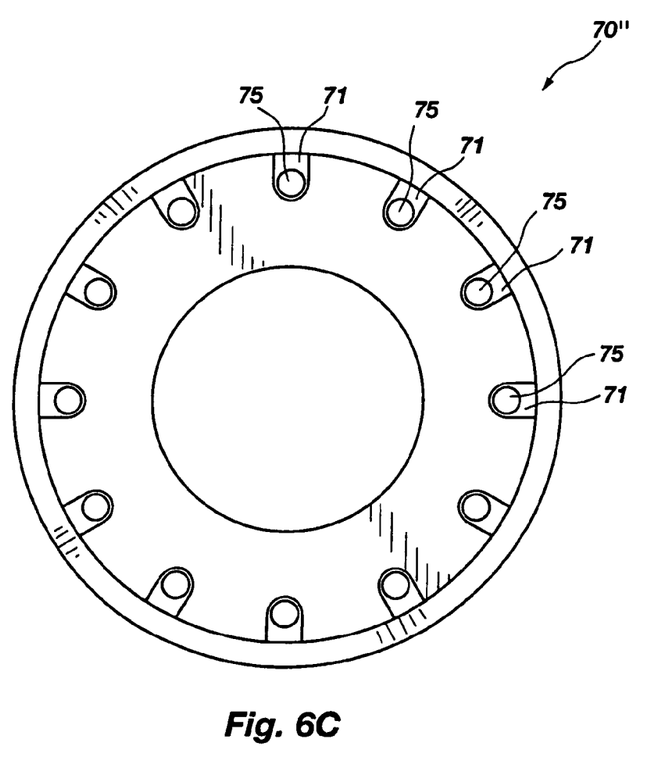
FIGS. 6C and 6D are top and side views, respectively, of an embodiment of a retention ring incorporating teachings of the present invention.
Figure 6D:
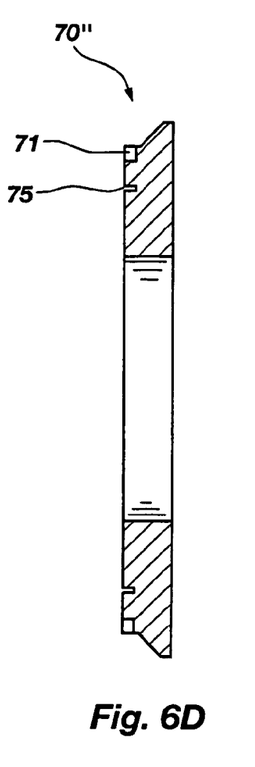
Figure 7:
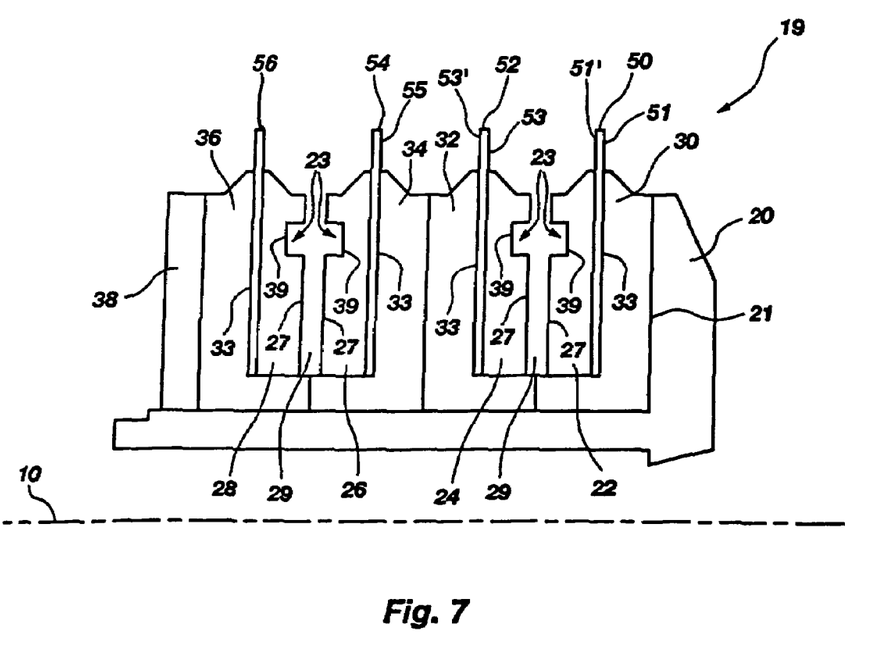
FIG. 7 is a partial side cross-sectional view of a third embodiment of a blade retention assembly incorporating the teachings of the present invention.
Figure 8:
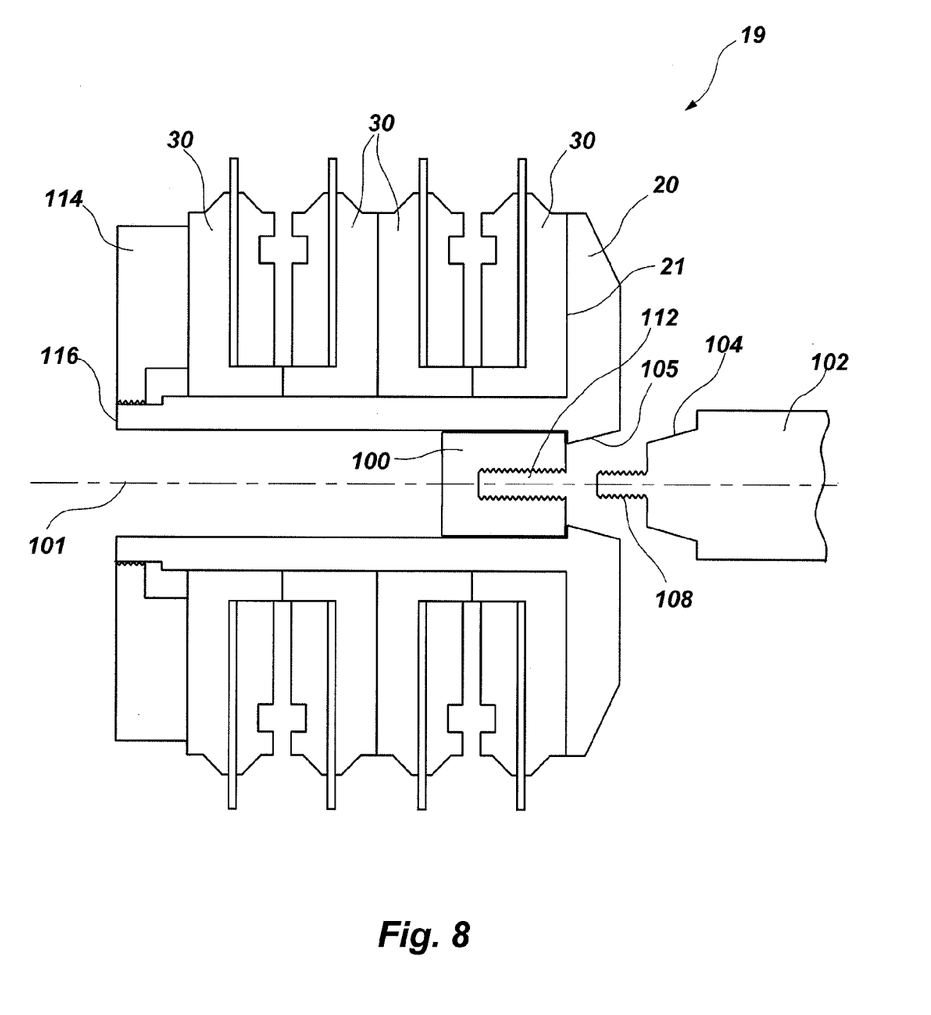
FIG. 8 is a schematic cross-sectional representation of an exemplary blade retention assembly.

As a further advantage, individualized biasing elements may allow for installation and replacement of biasing elements without complete disassembly of a dicing saw blade retention assembly (as shown in FIG. 3, FIG. 4A, or FIG. 7). For instance, in FIGS. 6C and 6D a retention spacer 70" is shown with radial slots 71 and elevated seats 75. A biasing element (not shown) may be installed into and around elevated seat 75 by way of slot 71 without dismantling an entire dicing saw blade assembly. The biasing element (not shown) may be compressed to fit into the slot 71 when the blade retention assembly is fully assembled. The means to compress the blade retention assembly may be loosened to allow additional clearance for biasing element installation.

FIG. 7 illustrates yet another embodiment of a dicing saw blade retention assembly 19 of the present invention wherein a biasing element (not shown) axially biases more than one retention spacer, thus biasing more than one dicing saw blade. Shaped flange 30 and shaped flange 32 are of substantially identical geometry, but installed such that the shaped flange 30 is axially opposed to shaped flange 32, axially opposed meaning that congruent axial surfaces of each flange are facing each other. Similarly, retention elements 22 and 24 are also substantially identical in geometry, and are installed on hub 20 in an opposing axial relationship. Thus, recesses 23 are radially aligned and are also longitudinally opposing, allowing for a single biasing element (not shown) to be installed between retention element 22 and retention element 24. Further dicing saw blade installation may be accomplished as shown by dicing saw blades 54 and 56.

Dicing saw blade spacing as determined by the fixtures depicted in FIG. 7 is different than the embodiments depicted in FIG. 3A and FIG. 4A. In FIG. 7, pairs of shaped flanges facing in opposite directions position dicing saw blades that may be axially centered on each flange. Furthermore, pairs of retention spacers are configured with an associated pair of flanges and are also facing in opposite directions, separated by a biasing element. The first pair of shaped flanges 30 and 32 are facing in opposite directions with dicing saw blades 50 and 52 matingly engaging each axial surface 33 of each flange. Retention elements 22 and 24 are respectively configured with flanges 30 and 32, respectively, and are also facing each other, in opposing fashion, so that radial surface 27 of retention element 22 is directly axially adjacent to the radial surface 27 of retention element 24. A biasing element (not shown) separates radial surface 27 of retention element 22 from radial surface 27 of retention element 24 and is positioned between radial surface 39 of the recess 23 in retention element 22 and radial surface 39 of the recess 23 in retention element 24. Axial distance 29 depends on the thickness of dicing saw blades 50 and 52 as well as the axial dimension of retention elements 22 and 24. Axial distance 29 provides axial allowance for accommodating blades of differing thickness without affecting the axial distance between axially distal radial surfaces of the dicing saw blades 50 and 52.

Notably, axially adjacent dicing saw blades 50 and 52 in FIG. 7 are spaced in relationship to noncongruent sides of each dicing saw blade 50, 52 of the pair. Therefore, dicing saw blade 50 and dicing saw blade 52 are positioned such that dicing saw blade surface 51 is a fixed axial distance from dicing saw blade side 53'. Likewise, dicing saw blade side 53' is a fixed axial distance from dicing saw blade surface 55. The relative position of each dicing saw blade with respect to an adjacent paired dicing saw blade is determined by the axial dimensions of the flange that contains the dicing saw blade, as well as the dimensions of the adjacent flange. In contrast, the embodiments shown in FIGS. 3A and 4A provide fixed distances between congruent sides of each dicing saw blade.

In addition, since dicing saw blade spacing may be determined by the axial dimensions of the shaped flange on either axial side of the dicing saw blade, it is preferable to place the dicing saw blade at the axial center of the shaped flange. Alternatively, if blades are placed nonsymmetrically within the axial dimension of the flange, additional auxiliary spacers may be placed between any adjacent flanges in order to achieve desired spacing.

The configuration shown in FIG. 7 may be advantageous, since dicing saw blade spacing of noncongruent sides of each dicing saw blade is independent of the dicing saw blade thicknesses and the number of biasing elements is reduced. Recesses 23 are longitudinally opposed and provide circumferential or peripheral constraint to an interposed biasing element (not shown). As mentioned hereinbefore, biasing elements may comprise springs, compliant materials, pressurized elements, elements that provide bias via centrifugal force, or other biasing means as known in the art. Multiple and different biasing elements may be used in combination.

Although the foregoing description contains many specifics, these should not be construed as limiting the scope of the present invention, but merely as providing illustrations of some exemplary embodiments. Similarly, other embodiments of the invention may be devised which do not depart from the scope of the present invention. Features from different embodiments may be employed in combination. The scope of the invention is, therefore, indicated and limited only by the appended claims and their legal equivalents, rather than by the foregoing description. All additions, deletions, and modifications to the invention as disclosed herein and which fall within the meaning and scope of the claims are to be embraced thereby.

What is claimed is:

1. A dicing saw assembly, comprising:
    a shaped flange including:
        a substantially radially extending support member including a recess in a surface thereof; and
        a substantially axially extending spacer member for spacing an adjacent radially extending surface of the support member a fixed distance apart from another shaped flange;
    a retention element within the recess of the spacer member of the shaped flange;
    a circular dicing saw blade positioned on the spacer member of the shaped flange, between the support member of the shaped flange and the retention element; and
    at least one biasing element circumferentially constrained by the recess and located adjacent the retention element to bias the circular dicing saw blade against at least one of the retention element and the support member.

2. The dicing saw assembly of claim 1, wherein the shaped flange and the another shaped flange are oriented in opposite directions.

3. The dicing saw assembly of claim 1, further comprising:
    another retention element positioned on a spacer member of the another shaped flange; and
    another circular dicing saw blade positioned between the another retention element and a support member of the another shaped flange, the at least one biasing element being positioned between the retention element and the another retention element to bias the retention element against the circular dicing saw blade and the another retention element against the another circular dicing saw blade.

4. The dicing saw assembly of claim 1, wherein the shaped flange and the another shaped flange are oriented in the same direction.

5. The dicing saw assembly of claim 4, wherein the at least one biasing element is positioned between a support member of the another shaped flange and the retention element.

6. The dicing saw assembly of claim 5, further comprising:
    another axially adjacent member positioned adjacent to a spacer member of the another shaped flange;
    another retention element positioned on the spacer member of the another shaped flange;
    another circular dicing saw blade positioned between the another retention element and the support member of the another shaped flange; and
    at least one other biasing element positioned between the another axially adjacent member and the another retention element, opposite the another circular dicing saw blade to bias the another retention element against the another circular dicing saw blade.

7. The dicing saw assembly of claim 1, wherein an aperture formed centrally through the retention element receives the spacer member of the shaped flange.

8. The dicing saw assembly of claim 1, wherein the at least one biasing element comprises a compressible, resilient structure.

9. The dicing saw assembly of claim 8, wherein the at least one biasing element comprises an o-ring.

10. The dicing saw assembly of claim 8, wherein the at least one biasing element comprises a spring.

11. The dicing saw assembly of claim 8, comprising a plurality of biasing elements arranged radially relative to the retention element.

12. The dicing saw assembly of claim 1, further comprising:
   a retention feature on at least one of the retention element and a surface of the support member of the shaped flange located opposite the spacer member thereof.

13. The dicing saw assembly of claim 12, wherein the retention feature comprises at least one recess configured to receive at least a portion of the at least one biasing element and to facilitate compression thereof 14. The dicing saw assembly of claim 13, wherein the at least one recess is configured to limit compression of the at least one biasing element.

15. A ganged dicing saw, comprising:
   at least two shaped flanges, each shaped flange including a support member that extends substantially radially and a spacer member that extends substantially axially for at least partially spacing an adjacent radially extending surface of the support member of one of the at least two shaped flanges a fixed distance apart from a corresponding radially extending surface of the support member of another of the at least two shaped flanges;
   at least two retention elements, each retention element having a recess in a surface therein positioned on the spacer member of a corresponding shaped flange of the at least two shaped flanges;
   at least two dicing saw blades, each saw blade positioned on the spacer member of one of the at least two shaped flanges, between the support member and the retention element of the corresponding shaped flange; and
   at least one biasing element circumferentially constrained by the recess and located adjacent at least one retention element of the at least two retention elements, opposite one dicing saw blade of the at least two dicing saw blades to bias the at least one retention element against the one dicing saw blade.

16. The ganged dicing saw of claim 15, further comprising:
   an axial spacer positioned axially between the at least two shaped flanges.

17. The ganged dicing saw of claim 15, wherein the at least two shaped flanges are oriented in opposite directions.

18. The ganged dicing saw of claim 17, wherein the spacer members of the at least two shaped flanges extend toward one another.

19. The ganged dicing saw of claim 18, wherein the at least one biasing element is positioned between adjacent ones of the at least two retention elements.

20. The ganged dicing saw of claim 15, wherein the at least two shaped flanges are oriented in the same direction.

21. The ganged dicing saw of claim 20, wherein the at least one biasing element is positioned between a support member of one of the at least two shaped flanges and a retention element that corresponds to another of the at least two shaped flanges.

22. The ganged dicing saw of claim 15, wherein an aperture formed centrally through each of the at least two retention elements receives the spacer members of the corresponding shaped flange.

23. The ganged dicing saw of claim 15, wherein the at least one biasing element comprises a compressible, resilient structure.

24. The ganged dicing saw of claim 23, wherein the at least one biasing element comprises an o-ring.

25. The ganged dicing saw of claim 23, wherein the at least one biasing element comprises a spring.

26. The ganged dicing saw of claim 23, comprising a plurality of biasing elements arranged radially relative to each of the at least two retention elements.

27. The ganged dicing saw of claim 15, further comprising retention features on at least one of the at least two retention elements and a surface of the support members of the at least two shaped flanges located opposite the spacer members thereof.

28. The ganged dicing saw of claim 27, wherein the retention features each comprise at least one recess configured to receive at least a portion of the at least one biasing element and to facilitate compression thereof.

29. The ganged dicing saw of claim 28, wherein the at least one recess is configured to limit compression of the at least one biasing element.

30. A method for fixing distances between ganged saw blades, comprising:
   assembling at least two shaped flanges onto a spindle of a ganged dicing saw, each shaped flange including a spacer member that extends substantially axially relative to the spindle and a support member that extends substantially radially relative to the spindle;
   placing a dicing saw blade onto the spacer member of each shaped flange;
   placing a retaining element with a recess in a surface therein onto the spacer member of each shaped flange, the dicing saw blade being positioned between the spacer member and the retaining element, adjacent to a surface of the retaining element opposite from the surface in which the recess is located;
   positioning at least one biasing element at least partially within the recess and adjacent at least one retaining element, opposite a corresponding dicing saw blade;
   forcing the at least two shaped flanges axially toward one another along the spindle, a distance between support members of the at least two shaped flanges being at least partially defined by the at least two shaped flanges, forcing at least partially compressing the at least one biasing element to bias the at least one retaining element against the corresponding dicing saw blade and securing the corresponding dicing saw blade between the at least one retaining element and the corresponding dicing saw blade; and
   securing at least the at least two shaped flanges into position along the spindle.

31. The method of claim 30, wherein assembling comprises assembling the at least two shaped flanges in opposite orientations.

32. The method of claim 31, wherein assembling comprises assembling the at least two shaped flanges in opposite orientations with the spacer members facing one another.

33. The method of claim 32, wherein positioning comprises positioning the at least one biasing element between retaining elements on spacer members of the at least two shaped flanges.

34. The method of claim 30, wherein assembling comprises assembling the at least two shaped flanges in the same orientation.

35. A method for securing a saw blade to a spindle, comprising:
placing at least one shaped flange on a spindle of a saw, the at least one shaped flange including a spacer member that extends substantially axially relative to the spindle and a support member that extends substantially radially relative to the spindle;
placing a dicing saw blade onto the spacer member of the at least one shaped flange;
placing a retaining element with a recess in a surface therein onto the spacer member of the at least one shaped flange with at least one biasing element circumferentially constrained by the recess and being positioned between the retaining element and the spacer member, the dicing saw blade being positioned between the spacer member and retaining element, adjacent to a surface of the retaining element opposite from the surface in which the recess is located; and
fixing an axial position of the at least one shaped flange along the spindle; and
at least partially fixing an axial position of the retaining element along the spindle, an at least partially axial fixed position of the retaining element, a fixed position of the at least one shaped flange, and the at least one biasing element securing the dicing saw blade in a fixed axial position along the spindle, between the support member of the at least one shaped flange and the retaining element.

36. A dicing saw assembly, comprising:
a shaped flange including a substantially radially extending support member and a substantially axially extending spacer member for spacing an adjacent radially extending surface of the support member a fixed distance apart from an axial spacer;
a retention element within a recess in a surface of the spacer member of the shaped flange;
a circular dicing saw blade fixedly positioned on the spacer member of the shaped flange, between the support member of the shaped flange and the retention element; and
at least one biasing element circumferentially constrained by the recess and located adjacent the retention element to bias the circular dicing saw blade against at least one of the retention element and the support member.

37. The dicing saw assembly of claim 36, further comprising:
at least one additional shaped flange positioned axially adjacent to the axial spacer, opposite the shaped flange;
at least one additional retention member with a recess in a surface therein positioned on a spacer member of the at least one additional shaped flange;
at least one additional saw blade positioned between the at least one additional retention member and a support member of the at least one additional shaped flange; and
at least another biasing element circumferentially constrained by the recess and located adjacent the at least one additional retention element, opposite the at least one additional saw blade to bias the at least one additional retention member against the at least one additional saw blade.

38. The dicing saw assembly of claim 36, wherein an aperture formed centrally through the retention element receives the spacer member of the shaped flange.

39. The dicing saw assembly of claim 36, wherein the at least one biasing element comprises a compressible, resilient structure.

40. The dicing saw assembly of claim 39, wherein the at least one biasing element comprises an o-ring.

41. The dicing saw assembly of claim 39, wherein the at least one biasing element comprises a spring.

42. The dicing saw assembly of claim 39, comprising a plurality of biasing elements arranged radially relative to the retention element.

43. The dicing saw assembly of claim 39, further comprising:
a retention feature on at least one of the retention element and a surface of the support member of the shaped flange located opposite the spacer member thereof.

44. The dicing saw assembly of claim 43, wherein the retention feature comprises at least one recess configured to receive at least a portion of the at least one biasing element and to facilitate compression thereof.

45. The dicing saw assembly of claim 44, wherein the at least one recess is configured to limit compression of the at least one biasing element.

* * * * *

UNITED STATES PATENT AND TRADEMARK OFFICE
CERTIFICATE OF CORRECTION

| | | |
|---|---|---|
| PATENT NO. | : 7,533,665 B2 | Page 1 of 1 |
| APPLICATION NO. | : 11/177526 | |
| DATED | : May 19, 2009 | |
| INVENTOR(S) | : Hamilton | |

It is certified that error appears in the above-identified patent and that said Letters Patent is hereby corrected as shown below:

In column 11, line 25, in Claim 13, delete "thereof" and insert -- thereof. --, therefor.

In column 12, line 60, in Claim 30, after "securing" delete "at least".

Signed and Sealed this

Sixteenth Day of March, 2010

David J. Kappos
*Director of the United States Patent and Trademark Office*